United States Patent [19]
Ogoh

[11] Patent Number: 5,254,866
[45] Date of Patent: Oct. 19, 1993

[54] LDD CMOS WITH WIDER OXIDE SIDEWALL ON PMOS THAN NMOS

[75] Inventor: Ikuo Ogoh, Hyogo, Japan

[73] Assignee: Mitsubishi Denki Kabushiki Kaisha, Tokyo, Japan

[21] Appl. No.: 675,593

[22] Filed: Mar. 28, 1991

[30] Foreign Application Priority Data

Apr. 3, 1990 [JP] Japan .................. 2-89508

[51] Int. Cl.⁵ .......................... H01L 27/092
[52] U.S. Cl. .................. 257/369; 257/344; 257/408; 257/900
[58] Field of Search .......... 357/23.3, 23.9, 42; 257/900, 344, 369, 408

[56] References Cited

U.S. PATENT DOCUMENTS

| | | | |
|---|---|---|---|
| 4,760,033 | 7/1988 | Mueller | 437/34 |
| 4,935,379 | 6/1990 | Toyoshima | 357/23.3 |
| 4,937,645 | 6/1990 | Ootsuka et al. | 357/23.3 |
| 5,061,975 | 10/1991 | Inuishi et al. | 357/23.3 |

FOREIGN PATENT DOCUMENTS

| | | |
|---|---|---|
| 0244607 | 11/1987 | European Pat. Off. |
| 0396357 | 11/1990 | European Pat. Off. |
| 61-5571 | 1/1986 | Japan |
| 63-226055 | 9/1988 | Japan |
| 63-246865 | 10/1988 | Japan |

*Primary Examiner*—William D. Larkins
*Attorney, Agent, or Firm*—Lowe, Price, Leblanc & Becker

[57] ABSTRACT

A semiconductor device comprises a semiconductor substrate (11) having first and second field effect transistors. Each transistor includes a gate electrode (17, 18) formed on the semiconductor substrate with a gate insulating film (15, 16) interposed therebetween. A first side wall spacer (21, 22) formed of one layer of an insulating film on opposite side wall surface of the gate electrode, and source/drain regions (19, 24, 26, 30), each comprising high and/or low impurity concentration regions of the gate electrode (17, 18) on the surface of the semiconductor substrate (11). A second side wall spacer (27, 28) formed of another layer of an insulating film formed at least one side wall surface of the gate electrode (17, 18) of at least said second transistor. The first and/or the second side wall spacers (21, 22, 27, 28) form diffusion masks for adjusting distribution of impurity concentration of the transistors. Due to this structure, the widths of the side wall spacers (21, 22, 27, 28) as diffusion masks which are responsive to required characteristics, are attained for respective side walls of the gate electrodes (17, 18). The semiconductor device of such structure is manufactured by implanting impurity ions between the steps of forming the first and the second side wall spacers (21, 22, 27, 28) and each time covering prescribed region with a resist film (20, 23, 25, 29, 31, 33, 35).

6 Claims, 16 Drawing Sheets

HEAT TREATMENT
900~950°C, 1Hr

LDD CMOS WITH WIDER OXIDE SIDEWALL ON PMOS THAN NMOS

BACKGROUND OF THE INVENTION

1. Field of the Invention

The present invention relates to a semiconductor device and a method of manufacturing the same, and more particularly, it relates to a MOS (metal oxide semiconductor) field effect transistor having an LDD (lightly doped drain) structure and a method of manufacturing the same, for suppressing a hot carrier effect by reducing peak field strength of a drain depletion layer which is caused in a pinch-off state.

2. Description of the Background Art

A MOS field effect transistor is basically formed by providing a metal electrode on an Si substrate with a thin oxide film interposed therebetween for defining the so-called MOS capacitor, and arranging a source for serving as a carrier source and a drain for extracting carriers on both sides of the MOS capacitor. The metal electrode provided on the oxide film, which is adapted to control conductance between the source and the drain, is called a gate electrode. Such a gate electrode is generally prepared from a polysilicon material which is doped with impurity ions, or a metal silicide material which is formed by heat treating a metal having a high melting point, such as tungsten, deposited on a polysilicon material in inert gas.

When the voltage (gate voltage) of the gate electrode is lower than a threshold voltage $V_{th}$ which is necessary for inverting the conductivity type of a portion (channel) close to a surface portion of the Si substrate between the source and the drain, no current flows since the source and the drain are isolated from each other by p-n junction. When a gate voltage exceeding the threshold voltage $V_{th}$ is applied, the conductivity type of the channel surface is inverted to define a layer of the same conductivity type as the source and the drain in this portion, whereby a current flows across the source and the drain.

If distributions of impurity concentration are abruptly changed in the boundaries between the source, the drain and the channel, levels of field strength are increased in these portions. The carriers attain energy by such electric fields, to cause the so-called hot carriers. Such carriers are injected into the gate insulating film, to define interfacial levels at the interface between the gate insulating film and the semiconductor substrate, or be trapped in the gate insulating film. Thus, the threshold voltage and transconductance of the MOS transistor are deteriorated during the operation. This is the deterioration phenomenon of the MOS transistor caused by the hot carriers. Further, the so-called avalanche resistance against source-to-drain avalanche breakdown is also deteriorated by the hot carriers. The MOS-LDD field effect transistor is adapted to relax the field strength by reducing n-type impurity concentration in the vicinity of the source and the drain and loosening the change of concentration distributions, thereby suppressing deterioration of the MOS transistor caused by hot carriers and improving source-to-drain avalanche resistance.

A conventional MOS-LDD field effect transistor is manufactured by a method shown in FIGS. 1A to 1F, for example. According to this method, a gate insulating film 3 is formed by the so-called LOCOS method on an element forming region of a p-type semiconductor substrate 1 which is enclosed by an element isolation film 2 (FIG. 1A). Then, p-type impurity ions such as boron ions are implanted into the overall surface of the semiconductor substrate 1 at need for controlling a threshold voltage, to form an ion-implanted region 4 (FIG. 1B). Thereafter a polysilicon film is deposited on the overall surface of the gate insulating film 3 by a low pressure CVD process, to form a gate electrode 5 through photolithography and reactive ion etching (FIG. 1C). In place of the polysilicon film, the gate electrode 5 may be formed by a two-layer film of a metal having a high melting point such as tungsten, molybdenum or titanium, or a silicide thereof, and polysilicon. This gate electrode 5 is doped with phosphorus ions, for example, for improvement in conductivity.

Then, n-type impurity ions such as phosphorus ions or arsenic ions are vertically implanted into the surface of the semiconductor substrate 1 through the gate electrode 5, serving as a mask, to form n-type ion-implanted layers 6 (FIG. 1D). Thereafter an insulating film of silicon dioxide or the like is deposited on the overall surface of the semiconductor substrate 1 by a low pressure or normal pressure CVD process, and anisotropic etching is performed to form side wall spacers 7 (FIG. 1E). Then, n-type impurity ions such as phosphorus ions or arsenic ions are vertically applied to the surface of the semiconductor substrate 1, the gate electrode 5 and the side wall spacers 7, serving as masks, to form n-type implanted layers 8 which are higher in concentration than the ion-implanted layers 6 (FIG. 1F). Thereafter heat treatment is performed for activating the implanted impurity ions, thereby completing the MOS-LDD field effect transistor.

Although a p-type semiconductor substrate is employed in the aforementioned prior art, the substrate may be provided with a p-type well, in which p-type impurity ions are implanted, at least in the vicinity of its surface. Further, the substrate may be formed by an n-type semiconductor substrate, or a substrate provided with an n-type well, in which n-type impurity ions are implanted, at least in the vicinity of its surface. In this case, the gate electrode 5 is of the p-type, and p-type ion-implanted layers 6 and 8 are formed in the source and drain regions.

According to the MOS-LDD field effect transistor obtained by the aforementioned conventional method, the change in distribution of impurity concentration is relaxed in the source and drain regions since the ion-implanted regions 6 of lower concentration are provided on the sides of the source and drain regions adjacent to the channels. Thus, field strength levels are reduced in these portions, to prevent the transistor from the deterioration caused by the hot carriers.

In the conventional MOS-LDD structure, however, the low-concentration impurity diffusion layers (ion-implanted layers 6) of the source and drain regions are diffused laterally toward a portion under the gate electrode 5 upon high-temperature heat treatment in a later step. Thus, parasitic capacitance is added between the gate electrode 5 and the source and drain regions, to inhibit accelerating of an integrated circuit, and hinder refinement of the transistor.

A similar problem is caused in a complementary MOS integrated circuit, for example, which is provided with both n-channel and p-channel field effect transistors, when LDD structures are formed by the aforementioned conventional method. Since diffusion coefficients of impurity elements which are implanted into source and drain regions are varied with types thereof, the optimum width of a side wall spacer for the first conductivity type channel is not necessarily suitable for the region of the second conductivity type channel.

Also in the case of field effect transistors having the same conductivity type of channels, it is impossible to attain optimum widths of side wall spacers required for the respective transistors when concentration profiles of impurity diffusion layers of source and drain regions must be changed in response to performance required therefor.

Japanese Patent Laying-Open No. 61-5571 (1986), 63-226055 (1988) or 63-24686 (1988) discloses a conventional manufacturing method for solving the aforementioned problem. The manufacturing method described in such a gazette is adapted to separately form side wall spacers of n-channel and p-channel MOS transistors, which are provided on the same semiconductor substrate. Namely, when the side wall spacer for the first conductivity type channel is formed, an active region of the second conductivity type channel is covered with a resist film.

A typical example of such a conventional manufacture method is shown in FIGS. 2A through 2H. In this manufacture process, a gate electrode 5 is first formed on respective surfaces of a p-type region and n-type region of a semiconductor substrate 1, which are isolated from each other by an element isolation film 2, with a gate insulating film 3 interposed between the gate electrode 5 and the respective surfaces of the p-type and n-type regions. A silicon nitride film 9a is then deposited on the overall surface of the semiconductor substrate 1 (FIG. 2A). Only the nitride silicon film on the n-type region is thereafter covered with a resist mask (not shown), to remove only the silicon nitride film 9a formed on the p-type region. After the resist mask on the n-type region is removed (FIG. 2B), an insulating film 7a is deposited on the overall surface of the semiconductor substrate 1 (FIG. 2C). Then, the insulating film 7a is subjected to a reactive ion etching, thereby to form side wall spacers 7b and 7c (FIG. 2D). The silicon nitride film 9a formed on the n-type region and the side wall spacer 7c are then removed (FIG. 2E). After that, only the portion on the p-type region is covered with a silicon nitride film 9b. An insulating film 7d is again deposited on the overall surface of the semiconductor substrate 1 (FIG. 2F) with the portion on the p-type region covered with the silicon nitride film 2b. This insulating film 7d is thereafter subjected to the reactive ion etching, so as to form side wall spacers 7e and 7f (FIG. 2G). Then, the silicon nitride film 9b formed on the p-type region and the side wall spacer 7e are removed, so that the side wall spacers 7b and 7f are formed on the p-type region and the n-type region, respectively. According to the technique described in the above gazette, it is possible to make the widths of the side wall spacers for the p-type and n-type channels different from each other at need. However, although the resist film can be formed through a single step for each conductivity type channel region, CVD processes for forming all side wall spacers require long times since only those for the channel region of one conductivity type are formed in a single CVD process. This leads to a problem since the CVD processing time is relatively long as compared with formation of the resist film (FIG. 2H).

SUMMARY OF THE INVENTION

An object of the present invention is to provide a structure of a semiconductor device including a MOS-LDD field effect transistor circuit in which widths can be varied with side wall spacers as masks for adjusting distribution of impurity concentration at need in a relatively short CVD processing time, and a method of manufacturing the same.

Another object of the present invention is to provide a method of manufacturing a semiconductor device including a field effect transistor circuit which can easily adjust offsetting of source and drain regions etc. in response to conductivity types in the case of simultaneously forming p-channel and n-channel field effect transistors on the same semiconductor substrate.

A semiconductor device according to the present invention comprises a semiconductor substrate having first and second field effect transistors. Each transistor includes a gate electrode formed on the semiconductor substrate with a gate insulating film interposed therebetween. A first side wall spacer is formed of one layer of an insulation film on opposite side wall surfaces of said gate electrode, and source/drain regions, each comprising laterally arranged high and/or low impurity concentration regions, are formed outwardly from portions close to opposite side portions of the gate electrode on the surface of the semiconductor substrate. A second side wall spacer is formed of another layer of an insulating films formed at least on one side wall surface of the gate electrode of at least said second transistor. The first side wall spacer for the first transistor forms a diffusion mask for implanting the high impurity concentration regions respectively on opposite sides of the gate electrode, and the second side wall spacer for the second transistor forms a diffusion mask for implanting said high impurity concentration regions on at least one side of said gate electrode.

According to the field effect transistor having the aforementioned structure, side wall spacers are formed by oxide insulating films having prescribed layer numbers for the respective side walls of the gate electrode, whereby the source and drain regions have distributions of impurity concentration which are responsive to the conductivity type of the channel and desired characteristics. Thus, it is possible to obtain a MOS-LDD field effect transistor having appropriately controlled distributions of impurity concentration in source and drain regions.

A method of manufacturing a semiconductor device including a field effect transistor circuit comprising first and second transistors having LDD formed on the major surface of a semiconductor substrate, according to the present invention, comprises the steps as follows. First, a gate electrode is formed for each transistor insulated from the major surface of the substrate by a gate insulating film. Secondly, first side wall spacers are formed by depositing an oxide insulating film on opposite side wall surfaces of said gate electrodes and anisotropically etching the oxide insulating film. And then, by using said first side wall spacers of the first transistor as a mask, impurity ions of a conductivity type opposite that of said substrate and having a relatively high impurity concentration are implanted into the substrate. Next, second side wall spacers are formed by depositing an oxide insulating film on the gate electrodes and the first side walls of at least said second transistor and anisotropically etching the oxide insulating film. And then, by using the second side wall spacers of the second transistor as a mask, impurity ions of the conductivity type opposite that of the substrate and having a relatively high impurity concentration density are implanted into the substrate.

According to the method of manufacturing a semiconductor device including a field effect transistor circuit having the aforementioned steps, side wall spacers having different widths are not separately but simultaneously formed by successively repeating deposition of oxide insulating films and anisotropic etching a plurality of times while covering a position to have a smaller side wall width with a resist film at need. Thus, efficiency in formation of the side wall spacers is improved as compared with the case of separately forming side wall spacers of different widths. The factor for such improvement in efficiency is explained as follows: In the aforementioned steps, it is necessary to pattern resist films by a number of times in response to the types of side wall spacer widths. However, a step of depositing oxide insulating films by CVD requires a longer time than a step of forming resist films. In the aforementioned steps, the oxide insulating films for the side wall spacers of different widths are simultaneously deposited and successively completed. Thus, the processing time can be extremely reduced as compared with the case of separately depositing oxide insulating films for side wall spacers of different widths by CVD.

In another aspect, the inventive method of manufacturing a semiconductor device including a field effect transistor comprises a step of forming a plurality of gate electrodes on respective surfaces of a plurality of active regions of a semiconductor substrate provided with p-type and n-type wells with interposition of gate insulating films, a step of forming side wall spacers on respective side walls of the plurality of gate electrodes by depositing insulating films and performing anisotropic etching, and a step of forming source and drain regions by implanting n-type impurity ions and p-type impurity ions into the p-type and n-type well regions respectively through only the gate electrodes, serving as masks, or the gate electrodes and the side wall spacers, serving as masks. According to this manufacturing method, the step of forming the side wall spacers is carried out by depositing the oxide insulating films and performing anisotropic etching a plurality of times. In the step of depositing the oxide insulating films a plurality of times, the gate electrode which is provided in the p-type well region is covered with a resist film at least once. Thus, the widths of the side wall spacers formed in the p-type well region are made smaller than those of the side wall spacers formed in the n-type well region.

According to this manufacturing method, the widths of the side wall spacers for a p-channel MOS transistor are made larger than those of the side wall spacers for an n-channel MOS transistor. Through the aforementioned steps, the offset amount of the p-channel MOS transistor, if controlled by the width of side wall spacers, is made larger than that of the n-channel MOS transistor. Thus, it is possible to obtain proper side wall widths in consideration of the fact that diffusion coefficients of p-type impurity ions are greater than those of n-type impurity ions.

According to the inventive field effect transistor, as hereinabove described, the side wall spacers have prescribed widths through deposition of insulating films of prescribed layer numbers determined for the respective side walls of the gate electrode. Thus, the source and drain regions are properly controlled, to provide a MOS-LDD field effect transistor having excellent characteristics.

According to the inventive method of manufacturing a field effect transistor, a plurality of layers of side wall spacers are formed in a plurality of steps and a resist film is selectively formed every step, whereby side wall spacers of prescribed widths are formed on side walls of gate electrodes. Consequently, it is possible to easily control offset lengths of impurity diffusion layers in source and drain regions, which are formed through the side wall spacers serving as masks. Further, the total time required for depositing oxide insulating films is reduced as compared with the case of forming side wall spacers of different widths in separate steps, whereby productivity is improved.

When the inventive manufacturing method is applied to steps of manufacturing a field effect transistor, such as a complementary MOSFET, having both p-type and n-type channel regions, the offset amount of the p-channel MOSFET can be easily controlled to be larger than that of the n-channel MOSFET in a refined MOSFET having channel lengths of not more than 1 $\mu$m. Thus, it is possible to provide a high-performance complementary MOSFET or the like in consideration of the fact that the diffusion coefficients of p-type impurity ions are larger than those of n-type impurity ions, at a relatively low cost.

These and other objects, features, aspects and advantages of the present invention will become more apparent from the following detailed description of the present invention when taken in conjunction with the accompanying drawings.

DESCRIPTION OF THE PREFERRED EMBODIMENTS

With reference to FIGS. 3A to 3J, a first embodiment of the present invention is now described. This embodiment is adapted to manufacture a complementary MOS integrated circuit while employing LDD structures for both n-channel and p-channel MOSFETs.

Figure 1A:
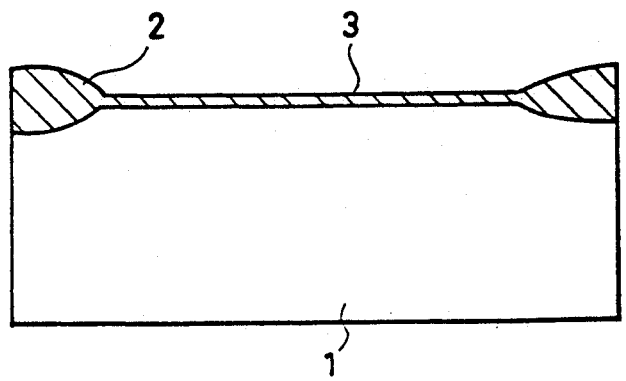
FIGS. 1A, 1B, 1C, 1D, 1E and 1F are sectional views successively showing steps of manufacturing a conventional MOS-LDD transistor.
Figure 1B:
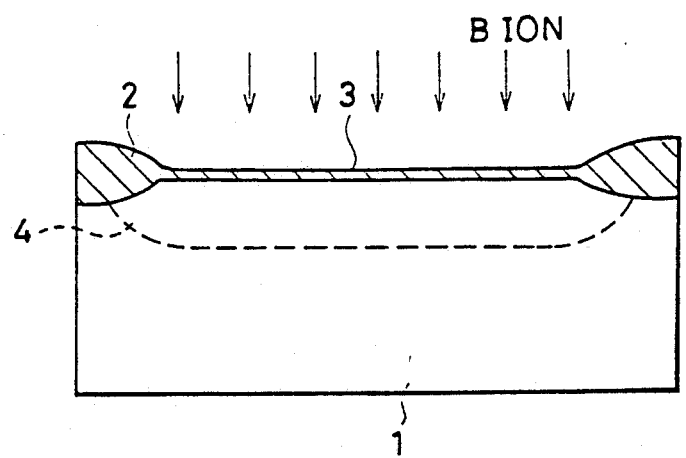
Figure 1C:
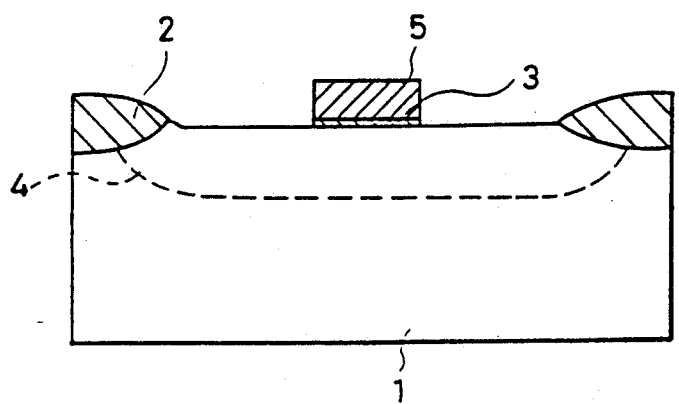
Figure 1D:
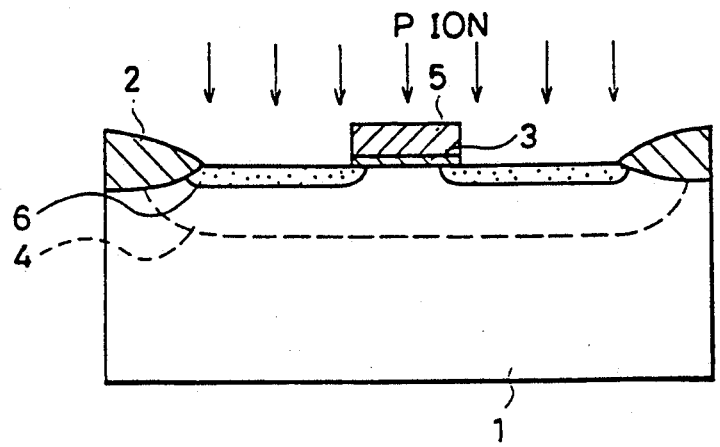
Figure 1E:
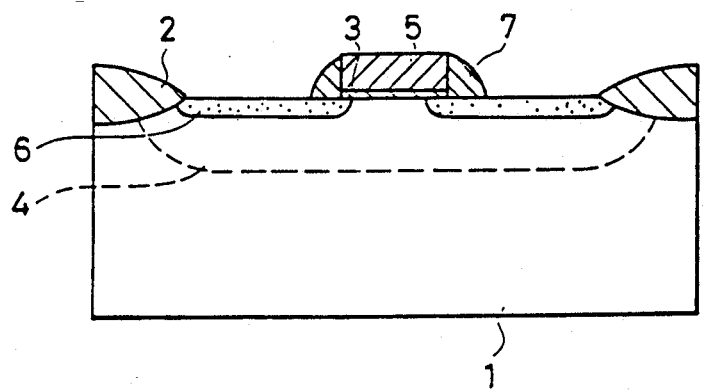
Figure 1F:
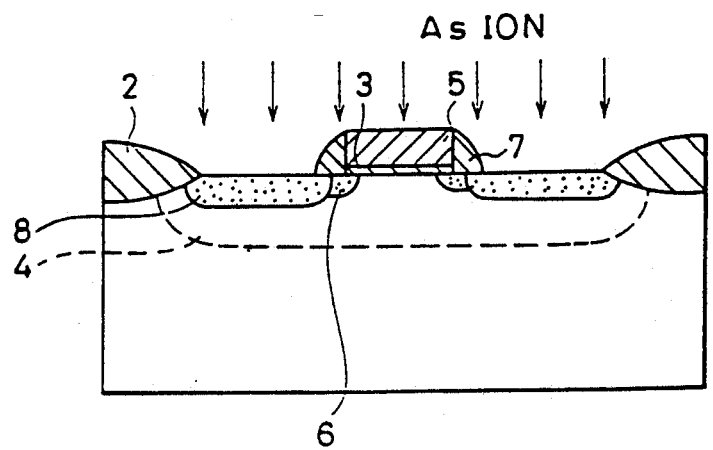
Figure 2A:
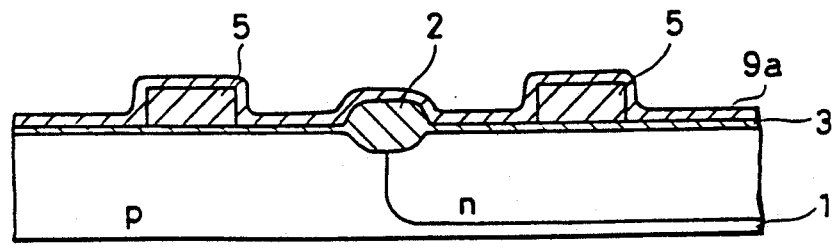
FIGS. 2A, 2B, 2C, 2D, 2E, 2F, 2G and 2H are sectional views successively showing conventional manufacture steps in case where respective side wall spacers of an n-channel MOS transistor and a p-channel MOS transistor are separately formed on the same semiconductor substrate.
Figure 2B:
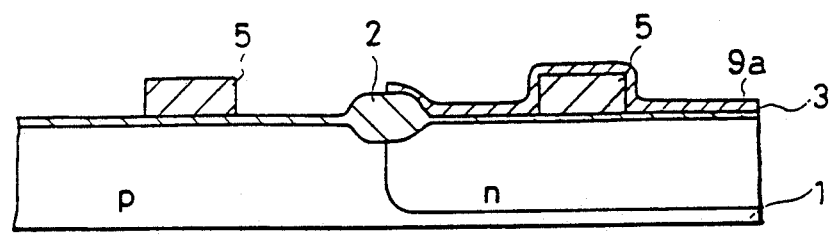
Figure 2C:
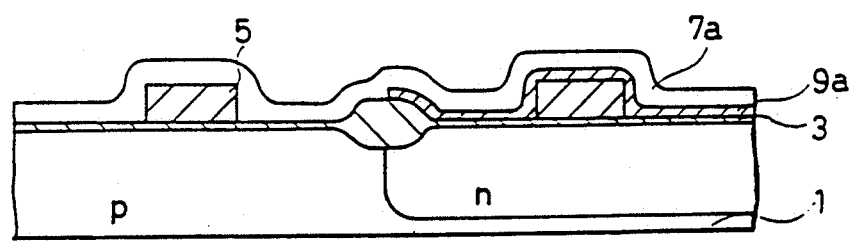
Figure 2D:
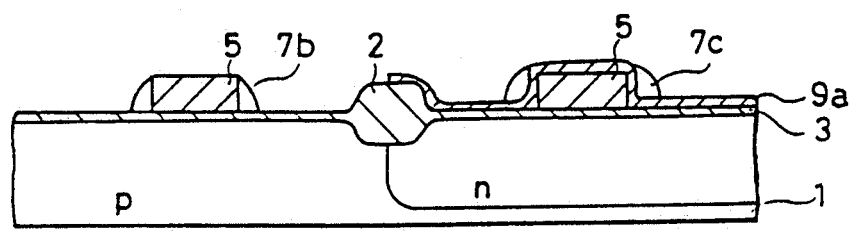
Figure 2E:
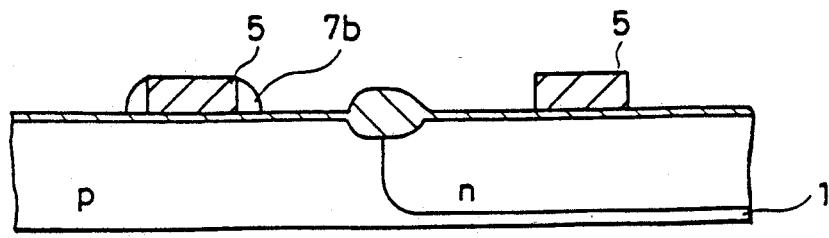
Figure 2F:
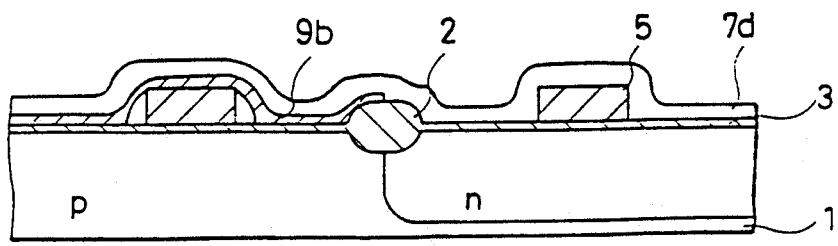
Figure 2G:
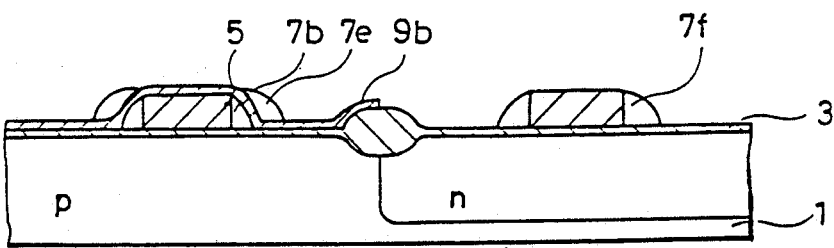
Figure 2H:
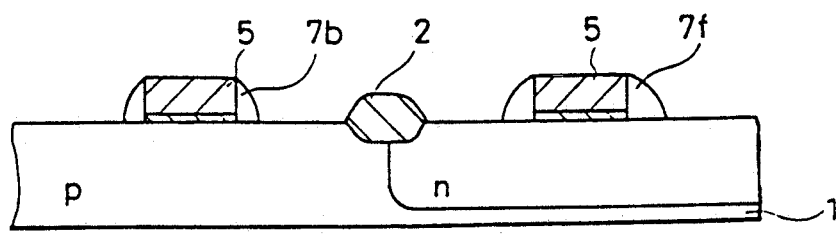
Figure 3A:
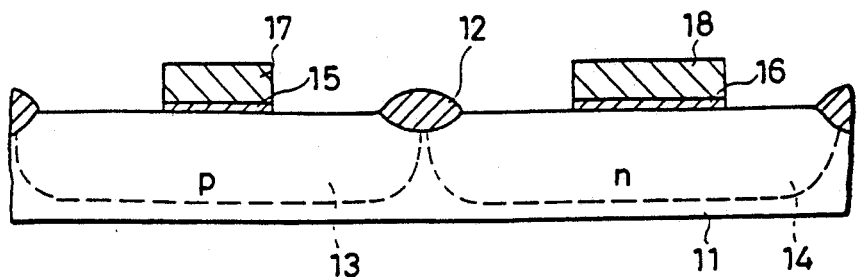
FIGS. 3A, 3B, 3C, 3D, 3E, 3F, 3G, 3H, 3I and 3J are sectional views successively showing steps of manufacturing a field effect transistor according to a first embodiment of the present invention.

According to this embodiment, an element isolation insulating film 12 is first formed by the so-called LOCOS method, in order to separate a semiconductor substrate 1 into a plurality of active regions. Thereafter p-type impurity ions such as boron ions and n-type impurity ions such as phosphorus or arsenic ions are implanted into the active regions, to form a p-type well region 13 and an n-type well region 14 respectively. Then, polycrystalline silicon materials doped with impurities are further deposited on the active regions through gate insulating films 15 and 16, or conductive materials such as metals having high melting points are worked by a well-known method, to form gate electrodes 17 and 18 (FIG. 3A).

Figure 3B:
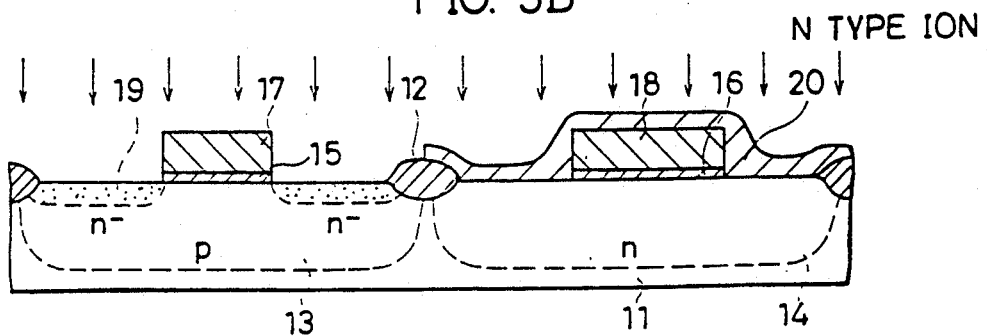

Then, the overall surface of the active region provided with the n-type well 14 is covered with a resist film 20, and n-type impurity ions such as phosphorus or arsenic ions are implanted only into a region for forming an n-channel MOSFET at application density of $10^{12}$ to $10^{14}$ cm$^{-2}$, so that low-concentration n-type diffusion layers 19 are formed on both sides through the gate electrode 17, serving as a mask, in a self-alignment manner (FIG. 3B).

Figure 3C:
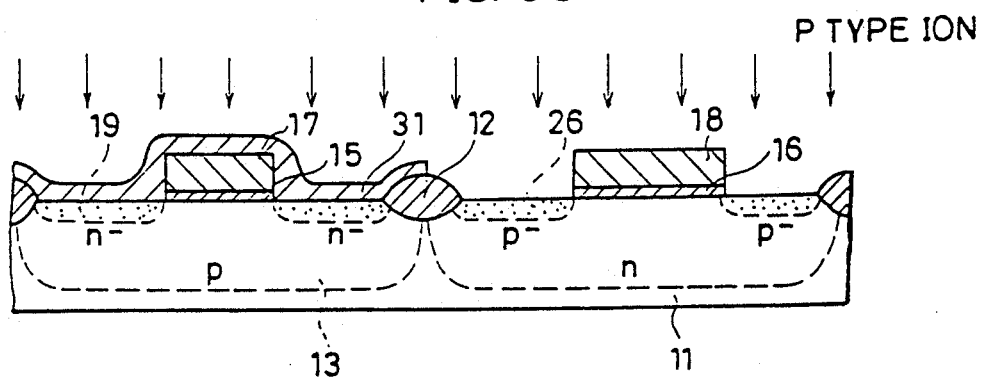

After the resist film 20 is removed, the overall surface of the active region provided with the p-type well is then covered with a resist film 31. Then, p-type impurity ions such as boron ions are implanted only into a region for forming a p-channel MOSFET at an application density of $10^{12}$ to $10^{14}$ cm$^{-2}$, so that low-concentration p-type diffusion layers 26 are formed in a self-aligning manner with the gate electrode 18 serving as a mask (FIG. 3C).

Figure 3D:
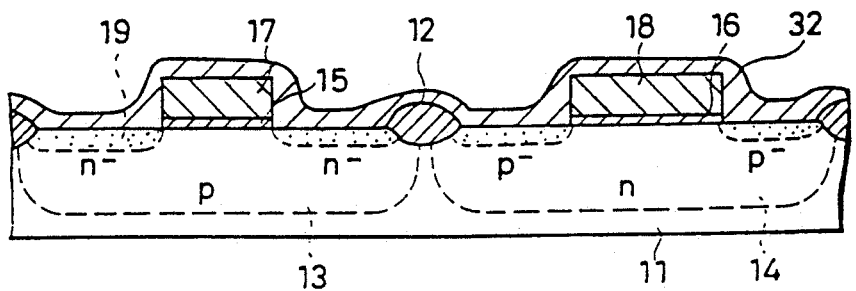
Figure 3E:
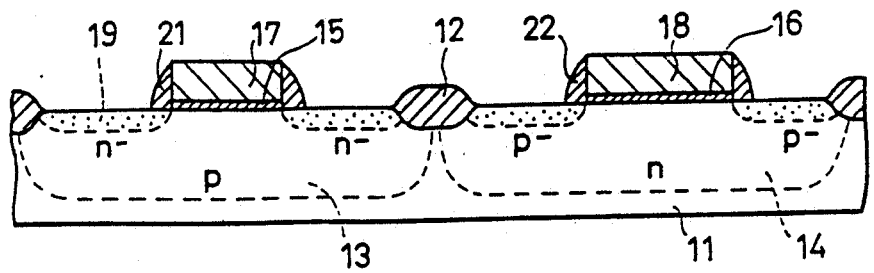

After the resist film 31 is removed, an oxide film 32 is deposited on the overall surface of the semiconductor substrate 11 by the CVD process or the like (FIG. 3D). The deposited oxide film 32 is then subjected to a reactive ion etching, to form side wall spacers 21 and 22 (FIG. 3E). The width of the side wall spacer 21 on the surface of the semiconductor substrate 11 is approximately proportional to the thickness of the oxide film 32.

Figure 3F:
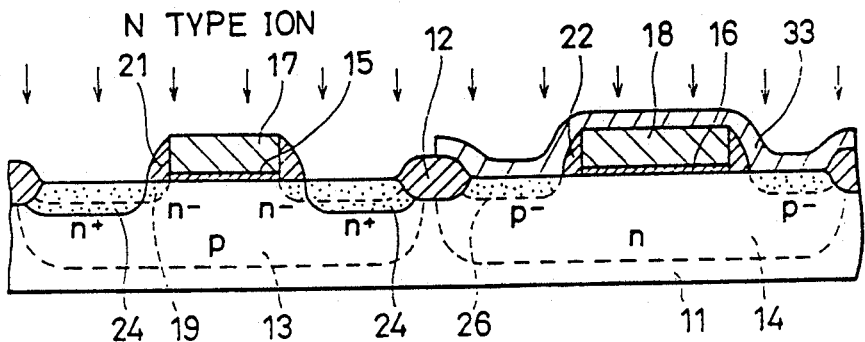

The overall surface on only the n-type well region 14 is then covered with a resist film 33. With the resist film 33 covering the overall surface, n-type impurity ions such as phosphorus or arsenic ions are implanted into the active region of the n-channel MOSFET at an application density of $10^{15}$ to $10^{17}$ cm$^{-2}$. Thus, with the gate electrode 17 and the side wall spacer 21 serving as masks, high-concentration n-type diffusion layers 24 are formed on both sides thereof in a self-alignment manner (FIG. 3F).

Figure 3G:
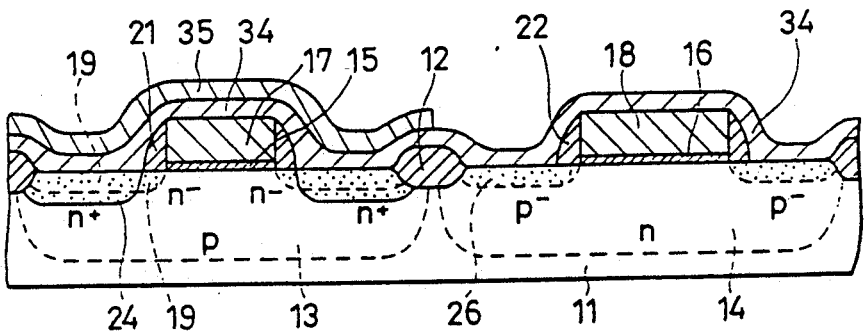
Figure 3H:
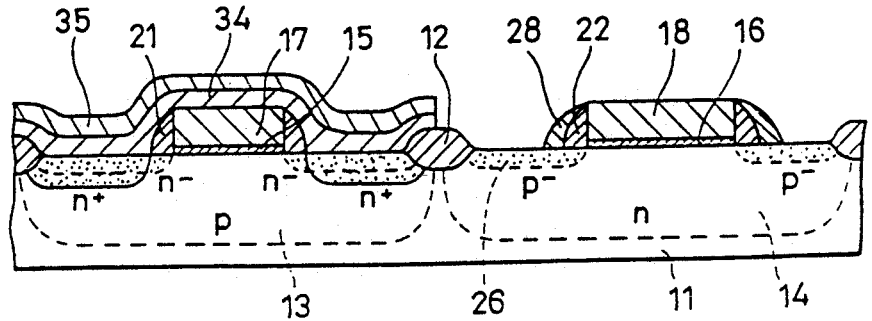
Figure 3I:
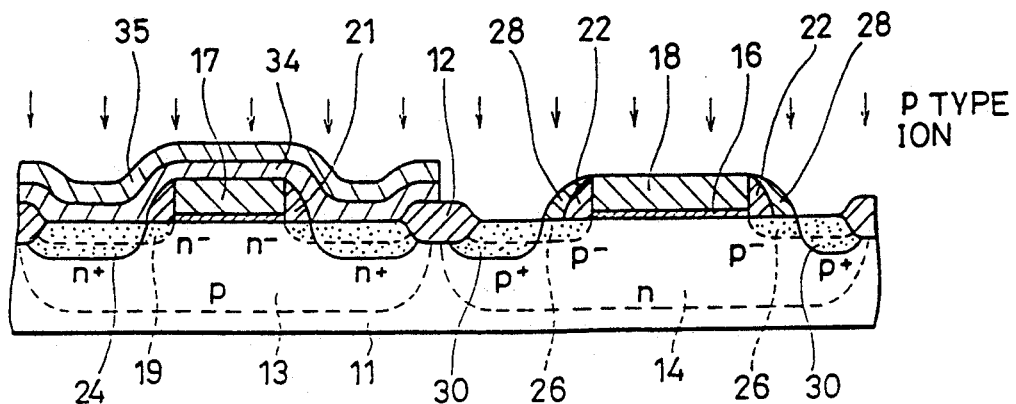

Then, an oxide film 34 is deposited on the overall surface of the semiconductor substrate 11 by CVD, and only the overall surface on the p-type well region 13 is covered with a resist film 35 (FIG. 3G). With the resist film 35 covering the overall surface, the oxide film 34 is subjected to a reactive ion etching, so as to form a side wall spacer 28 of a second layer on the n-type well region 14 (FIG. 3H). In this state, p-type impurity ions such as boron ions are implanted into the active region of the p-channel MOSFET at an application density of $10^{15}$ to $10^{17}$ cm$^{-2}$. Accordingly, with the gate electrode 18 and the side wall spacers 22 and 28 serving as masks, high-concentration p-type diffusion layers 30 are formed in a self-alignment manner on both sides thereof (FIG. 3I).

Figure 3J:
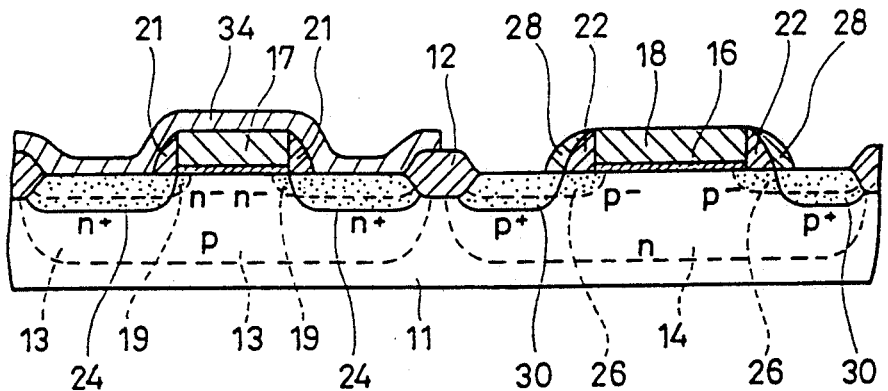

Performing a heat treatment on predetermined conditions after removal of the resist film 35 renders all of the low-concentration n-type diffusion layers 19, the high-concentration n-type diffusion layers 24, the low-concentration p-type diffusion layers 26 and the high-concentration p-type diffusion layers 30 active (FIG. 3J).

A second embodiment of the present invention will now be described with reference to FIGS. 4A through 4H. The steps shown in FIGS. 4A and 4B in this embodiment are the same as the steps shown in FIGS. 3A and 3B in the first embodiment.

Figure 4A:
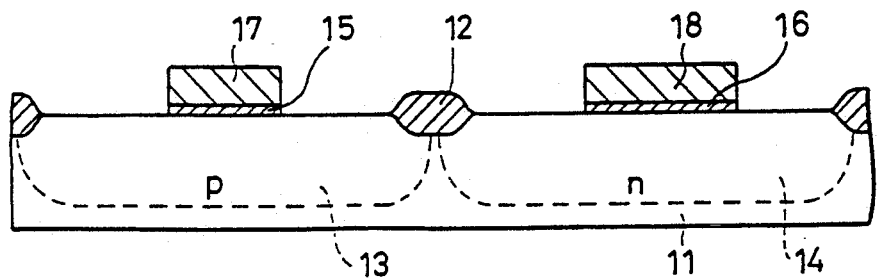
FIGS. 4A, 4B, 4C, 4D, 4E, 4F, 4G and 4H are sectional views successively showing steps of manufacturing a field effect transistor according to a second embodiment of the present invention.
Figure 4B:
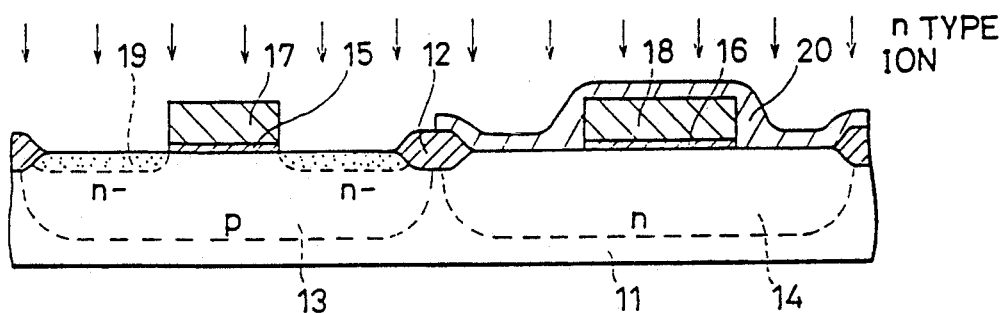
Figure 4C:
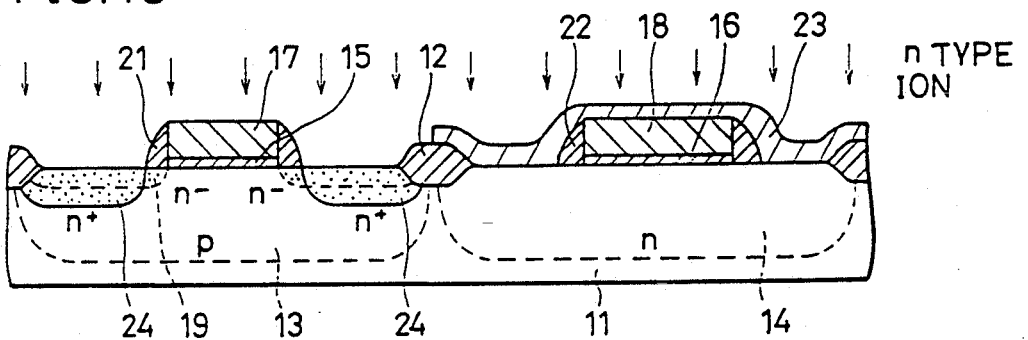

From the state of FIG. 4B, the resist film 20 is removed and an insulating film such as a silicon oxide film is formed by CVD on the overall surface in a certain thickness, and anisotropic etching is performed on the overall surface to form side wall spacers 21 and 22 on side walls of the gate electrodes 17 and 18. Thereafter a resist film 23 is formed on the overall surface of the active region provided with the n-type well 14, and n-type impurity ions are again implanted into the region for forming the n-channel MOSFET, so that high-concentration n-type diffusion layers 24 are formed in a self-alignment manner through the gate electrode 17 and the side wall spacers 21, serving as masks (FIG. 4C).

Figure 4D:
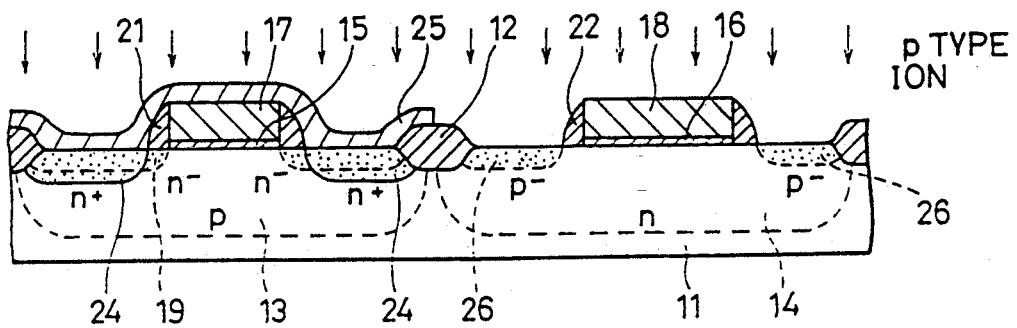
Figure 4E:
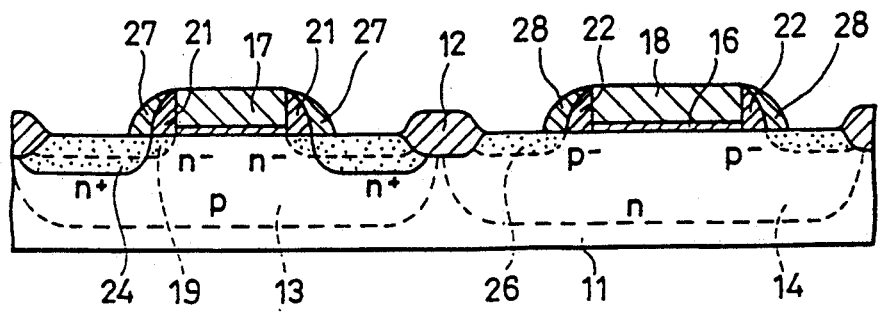
Figure 4F:
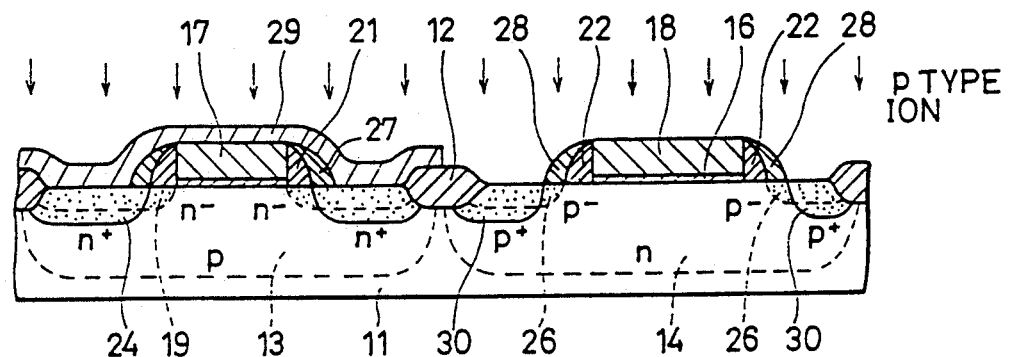

The resist film 23 is removed and another resist film 25 is formed on the overall surface of the active region provided on the p-type well region 13 for forming the n-channel MOSFET. In this state, p-type impurity ions such as boron ions are implanted into the active region for forming a p-channel MOSFET, to form low-concentration p-type diffusion layers 26 in a self-alignment manner through the gate electrode 18 and the side wall spacers 22, serving as masks (FIG. 4D). The resist film 25 is removed and an insulating film such as a silicon oxide film is formed on the overall surface in a certain thickness again by CVD, and anisotropic etching is performed on the overall surface, to form side wall spacers 27 and 28 on the side walls of the gate electrodes 17 and 18 (FIG. 4E). Then the overall surface of the active region for the n-channel MOSFET is covered with a resist film 29, and p-type impurity ions such as boron ions are implanted into the p-channel MOSFET region, so that high-concentration p-type diffusion layers 30 are formed in a self-alignment manner through the gate insulating film 18 and the side wall spacers 27 and 28, serving as masks (FIG. 4F).

Figure 4G:
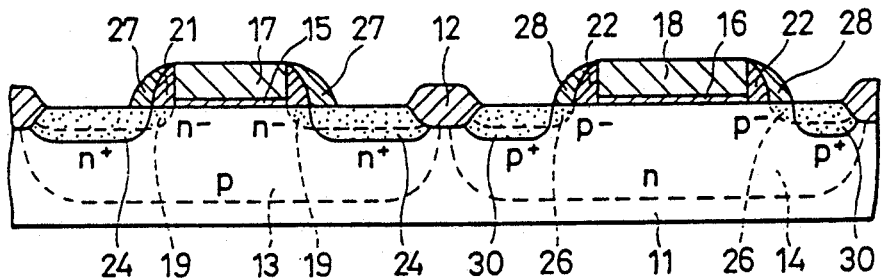
Figure 4H:
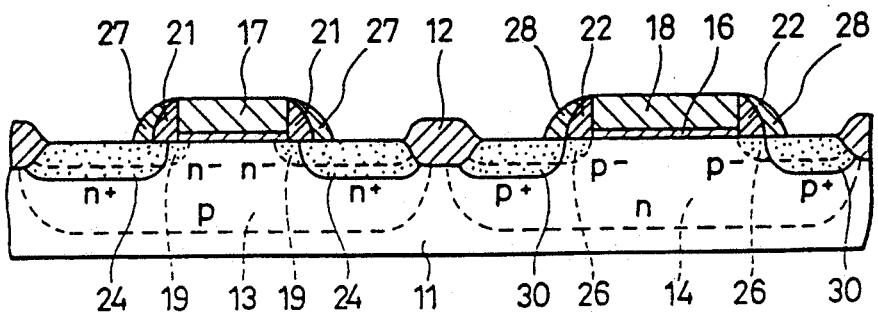

The resist film 29 is removed and heat treatment is performed under prescribed conditions, thereby activating the low-concentration n-type diffusion layers 19, the high-concentration n-type diffusion layers 24, the low-concentration p-type diffusion layers 26 and the high-concentration p-type diffusion layers 30 (FIG. 4G).

Through the aforementioned steps, according to the first and second embodiments, a complementary MOSFET is formed on the semiconductor substrate 11, so that both of the n-channel and p-channel MOSFETs have LDD structures.

According to these embodiments, as hereinabove described, the side wall spacers for the p-channel and n-channel MOSFETs are not formed through separate CVD and anisotropic etching spacers, but simultaneously formed. Further, it is possible to adjust offset lengths of source and drain regions etc. in response to conductivity types of the channels, by inserting the steps of implanting impurity ions between the steps of forming the respective ones of the plurality of side wall spacers. As to self-aligning formation of optimum source and drain regions in response to the conductivity types of the channels, therefore, steps of depositing oxide insulating films by CVD, which require extremely long processing times as compared with patterning of resist films, can be efficiently utilized while maintaining a possibility similar to that for the case of separately forming the side wall spacers. Thus, productivity is improved.

Figure 5A:
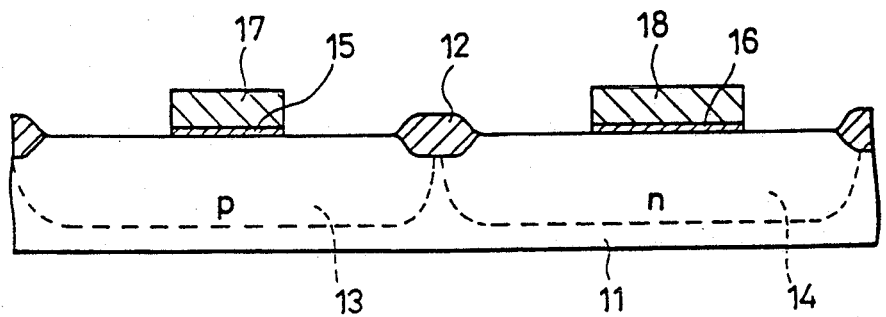
FIGS. 5A, 5B, 5C, 5D, 5E and 5F are sectional views successively showing steps of manufacturing a field effect transistor according to a third embodiment of the present invention.
Figure 5B:
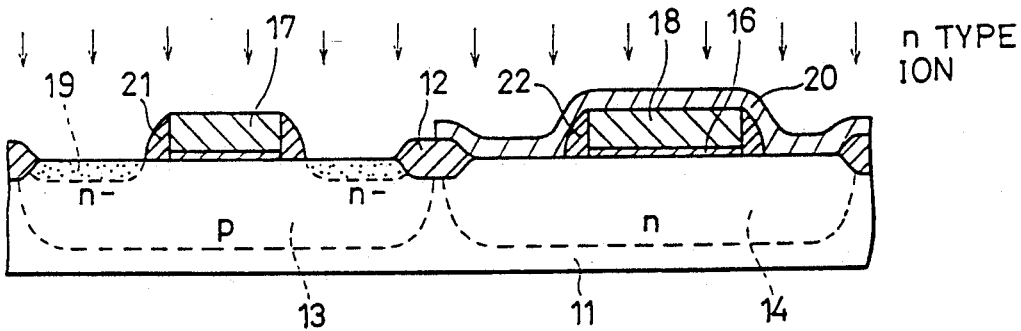
Figure 5C:
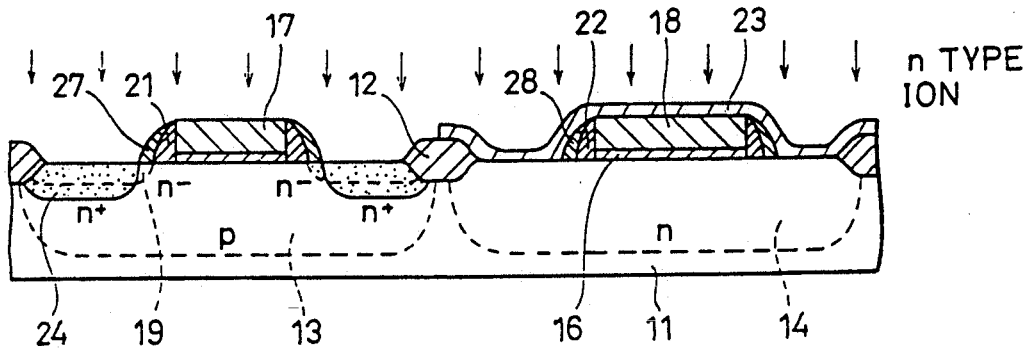

A third embodiment of the present invention is now described with reference to FIGS. 5A to 5F. According to this embodiment, a p-type well region 13 and an n-type well region 14 are formed in active regions of a semiconductor substrate 11 which are isolated by an element isolation insulating film 12 from each other, and gate electrodes 17 and 18 are formed through gate insulating films 15 and 16, similarly to the second embodiment (FIG. 5A). After the gate electrodes 17 and 18 are formed, first-layer side wall spacers 21 and 22 are formed by depositing oxide insulating films by CVD and performing anisotropic etching. Thereafter a region for forming a p-channel MOSFET is covered with a resist film 20, and n-type impurity ions such as phosphorus or arsenic ions are implanted to form low-concentration n-type diffusion layers 19 (FIG. 5B). Thereafter second-layer side wall spacers 27 and 28 are formed, and the region for forming the p-channel MOSFET is again covered with a resist film 23, and n-type impurity ions are implanted to form high-concentration n-type diffusion layers 24 (FIG. 5C).

Figure 5D:
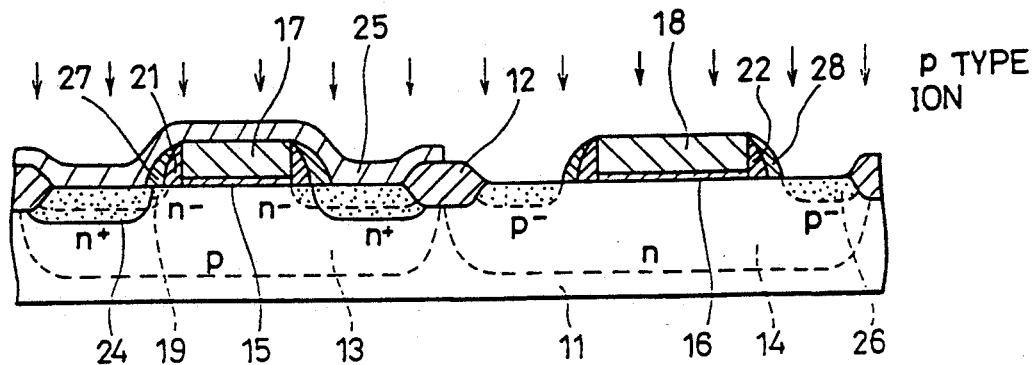
Figure 5E:
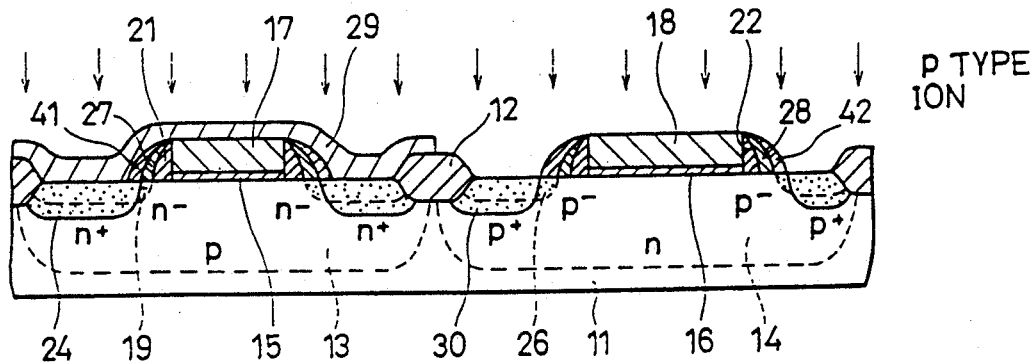
Figure 5F:
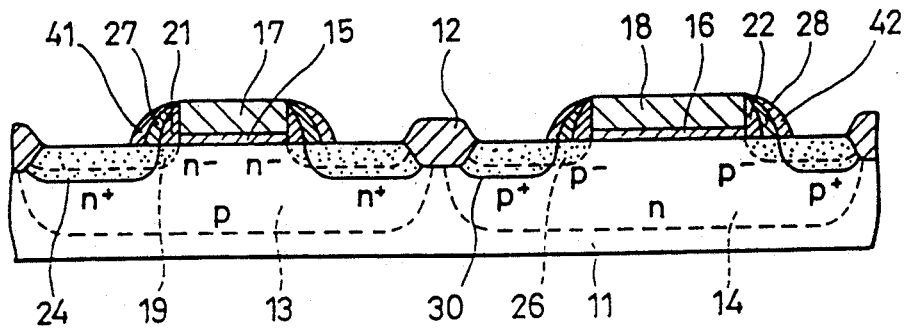

The resist film 23 is then removed and a region for forming an n-channel MOSFET is covered with a resist film 25, and p-type impurity ions such as boron ions are implanted to form low-concentration p-type diffusion layers 26 (FIG. 5D). The resist film 25 is removed, and then third-layer side wall spacers 41 and 42 are formed. Then, the region for forming the n-channel MOSFET is covered with a resist film 29, and p-type impurity ions are further implanted to form high-concentration p-type diffusion layers 30 (FIG. 5E). Thereafter the resist film 29 is removed and heat treatment is performed under prescribed conditions for activating the respective diffusion layers, thereby attaining a state shown in FIG. 5F.

According to this embodiment, as hereinabove described, a plurality of side wall spacers are formed by successively repeating deposition of oxide insulating films by CVD and anisotropic etching a plurality of times, while selectively forming resist films and implanting impurity ions, similarly to the first and second embodiments. This embodiment is different from the first embodiment in the point that it includes no step of implanting impurity ions through only the gate electrodes 17 and 18, serving as masks, and in the point that the side wall spacers are formed in three-layer structures. Also in this embodiment, it is possible to attain the function/effect of improving efficiency in the steps of forming the side wall spacers, similarly to the first embodiment. In the case of fine transistors of relatively low currents having channel widths of not more than 1 microns, impurity diffusion lengths of source and drain regions are relatively increased with respect to the channel widths. Thus, offsetting must indispensably be achieved by side wall spacers. Considering the fact that a p-type impurity has a larger diffusion coefficient than an n-type impurity, further, the widths of side wall spacers serving as masks for implanting p-type impurity ions must be larger than those of side wall spacers serving as masks for implanting n-type impurity ions. This embodiment satisfies such requirements by increasing the layer numbers of the side wall spacers for implanting p-type impurity ions as compared with those of the side wall spacers for implanting n-type impurity ions.

Figure 7A:
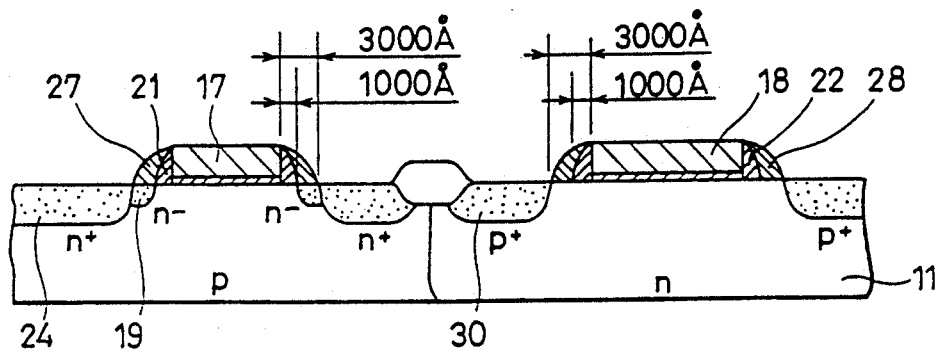
FIGS. 7A and 7B are sectional views showing an example of the difference in profile changes between an n type diffusion layer and a p type diffusion layer in source/drain regions, occurring after and before a heat treatment and caused by the difference in diffusion coefficients between those diffusion layers, in case where an n-channel MOS transistor and a p-channel MOS transistor are formed on the same semiconductor substrate.
Figure 7B:
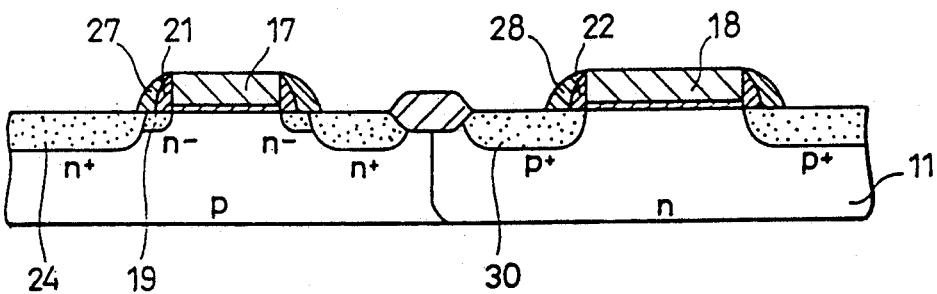

An example, showing in detail the difference in diffusion coefficients between p-type impurities and n-type impurities, will now be described for reference with reference to FIGS. 7A and 7B. In a p-type well for forming an n-channel MOSFET, phosphorus is implanted with a side wall spacer 21 having a width of 1000 Å on the surface of a semiconductor substrate 11, serving as a mask, so as to form low-concentration n-type diffusion layers 19. Further, high-concentration n-type diffusion layers 24 are formed with an additional side wall spacer having a width of 2000 Å, serving as a mask. In an n-type well for forming a p-channel MOSFET, boron is implanted with side wall spacers 22 and 28 having a total width of 3000 Å, serving as masks, so as to form high-concentration p-type diffusion layers 30 as shown in FIG. 7A. After that, a heat treatment is carried out at a temperature of 900°–950° C. for about one hour, so that each of the diffusion layers becomes activated, and also concentration distributions move due to thermal diffusion as shown in FIG. 7B. That is, it is found that the thermal diffusion of boron is considerably larger than that of n-type phosphorus or arsenic under the same heat treatment.

In the aforementioned third embodiment, the low-concentration p-type diffusion layers 26 for the p-channel MOSFET forming region can alternatively be formed in advance of the second-layer side walls 27 and 28 through the side wall spacers 22, serving as masks, while covering the region for forming the n-channel MOSFET with a resist film.

If only the low-concentration n-type diffusion layers 19 are formed and no low-concentration p-type diffusion layers 26 are formed in the first-layer side wall spacers 21 and 22 in the third embodiment, only the high-concentration p-type diffusion layers 30 are formed in the source and drain regions of the region for forming the p-channel MOSFET. In this case, only the region for forming the n-channel MOSFET can be brought into an LDD structure.

Figure 6A:
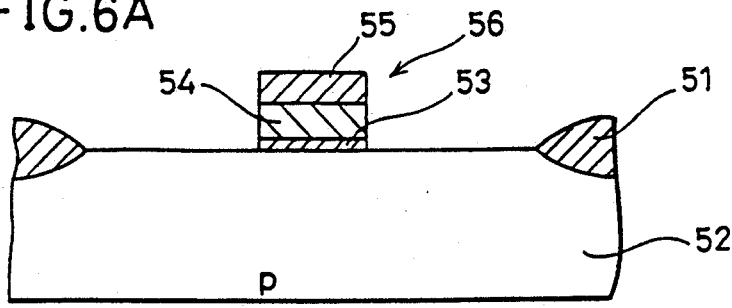
FIGS. 6A, 6B, 6C, 6D, 6E, 6F, 6G and 6H are sectional views successively showing steps of manufacturing a field effect transistor according to a fourth embodiment of the present invention.
Figure 6B:
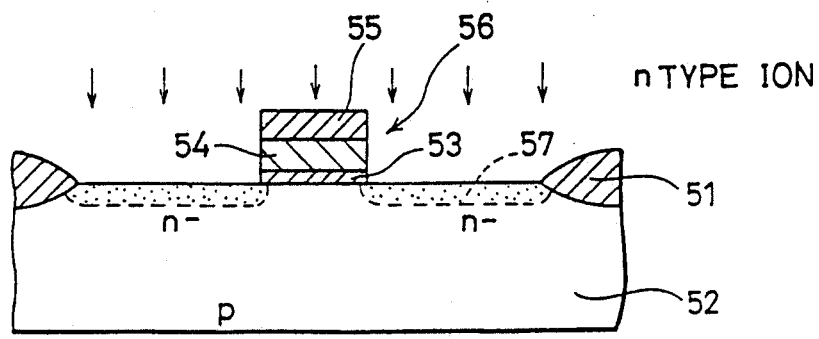
Figure 6C:
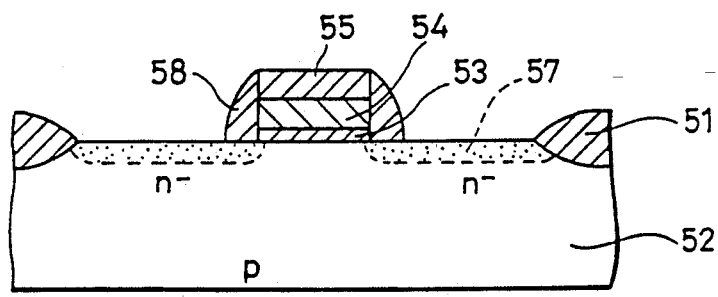
Figure 6D:
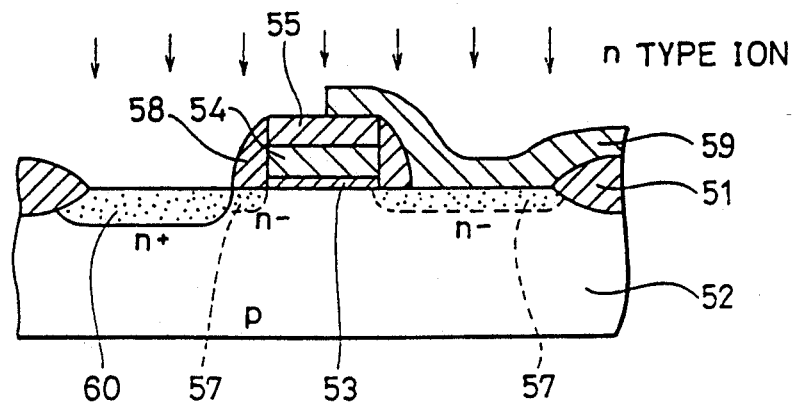

A fourth embodiment of the present invention is now described with reference to FIGS. 6A to 6H. According to this embodiment, a polycrystalline silicon layer 54 is first deposited on a surface of a p-type semiconductor substrate 52, which is separated into active regions by an element isolation insulating film 51, through a gate oxide film 53, and an oxide insulating film 55 is further formed thereon. Then portions of the gate insulating film 53 and the polycrystalline silicon layer 54 are removed by photo etching to leave only a gate electrode part 56, thereby attaining a structure shown in FIG. 6A. Then, n-type impurity ions such as phosphorus or arsenic ions are implanted, to form low-concentration n-type diffusion layers 57 on left and right sides through the gate electrode part 56, which serves as a mask (FIG. 6B). Thereafter an oxide insulating film of silicon oxide etc. is deposited on the overall surface of the semiconductor substrate 52 by CVD, and anisotropic etching is performed to form side wall spacers 58 (FIG. 6C). Thereafter a right half of the semiconductor substrate 52 is covered with a resist film 59 from the center of the gate electrode part 56, and n-type impurity ions are implanted to form a high-concentration n-type region 60 in a source region through the side wall spacer 58, serving as a mask (FIG. 6D).

Figure 6E:
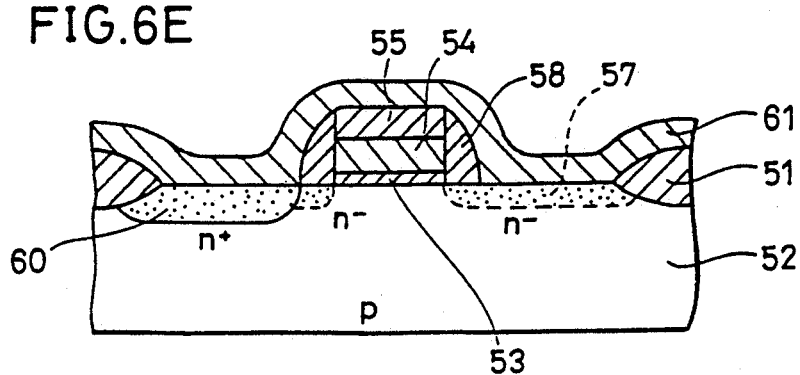
Figure 6F:
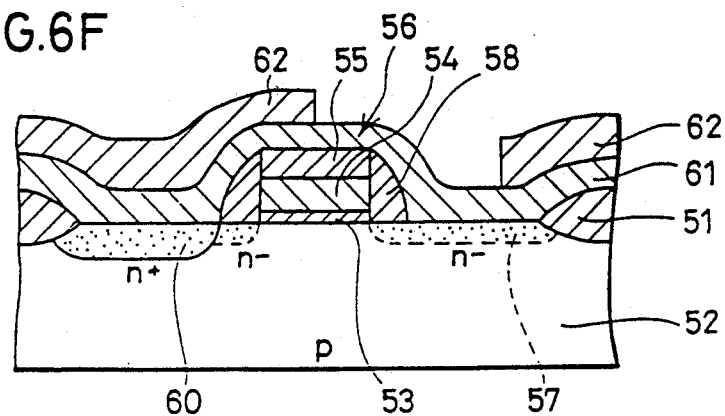
Figure 6G:
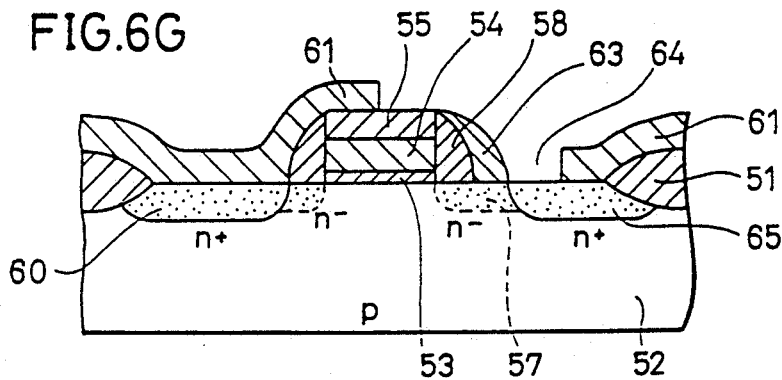

The resist film 59 is removed and then an oxide insulating film 61 of silicon oxide etc. is formed on the overall surface of the p-type semiconductor substrate 52 by CVD (FIG. 6E). Then a resist film 62 is selectively formed excepting a region between the center of the gate electrode part 56 and a drain region (FIG. 6F), and anisotropic etching is performed in this state to form a side wall spacer 63 and a contact hole 64. Then, n-type impurity ions are implanted through the side wall spacer 63, serving as a mask, to form a high-concentration n-type diffusion layer 65 in the drain region in a self-alignment manner (FIG. 6G).

Figure 6H:
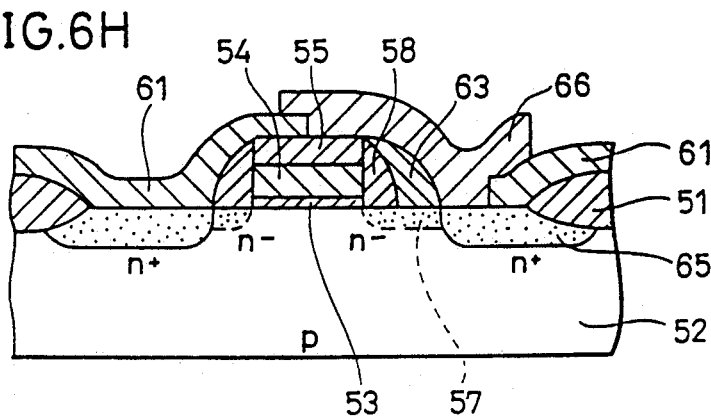

Then, a wiring layer 66, which is selectively provided with a metal layer or a doped polycrystalline silicon layer, is formed to allow conduction of the high-concentration n-type diffusion layer 65 through the contact hole 64 (FIG. 6H).

According to this embodiment, the side wall spacers 58 and 63 are so formed as to lengthen offsetting of the drain side, which is to be provided with the wiring layer 66, while the contact hole 64 is simultaneously formed. Thus, it is possible to effectively improve withstand voltage characteristics of the drain. Further, it is possible to suppress an adverse influence on the low-concentration n-type diffusion layer 58 due to impurity diffusions from the wiring layer 66.

Although the high-concentration n-type diffusion layer 65 is formed by implanting ions after the etching step for forming the side wall spacer 63 in this embodiment, the same can alternatively be formed by diffusion from impurity ions doped in a polysilicon layer which is formed as the wiring layer 66.

The description has been made as to the semiconductor device to which the present invention is applied in the case where the element isolation region is formed by the LOCOS method in each of the foregoing embodiments; however, it is needless to say that the same action and effect can be attained even if the present invention is applied to a semiconductor device in which an element isolation region is formed of a field shield electrode.

Figure 8:
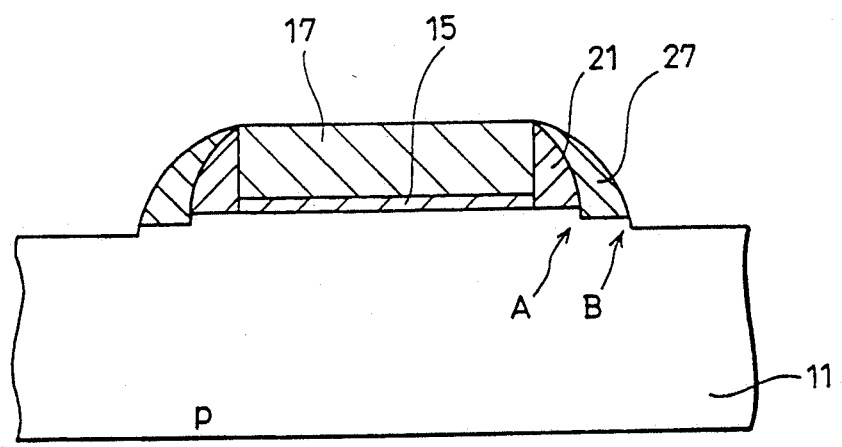
FIG. 8 is a sectional view for use in explaining a step-like configuration produced on the surface of a semiconductor substrate dependently on the number of plural layers forming a side wall spacer.

Further, in the foregoing embodiments, in the case where the side wall spacer is formed of a plurality of layers, it is difficult to identify the boundaries of the respective layers even if observing the cross section of a completed side wall spacer as far as those layers are formed by a CVD employing the same material. This is because a CVD film is amorphous. However, as shown in FIG. 8, step-like configurations (A and B of FIG. 8) are produced by over etching of the surface of the semiconductor substrate 11 upon formation of each of side wall spacers 21 and 27. Therefore, observing the step-like configurations from the cross section of a completed semiconductor device by an electron microscope makes it possible to determine whether or not the side wall spacers are formed of a plurality of layers.

Figure 9:
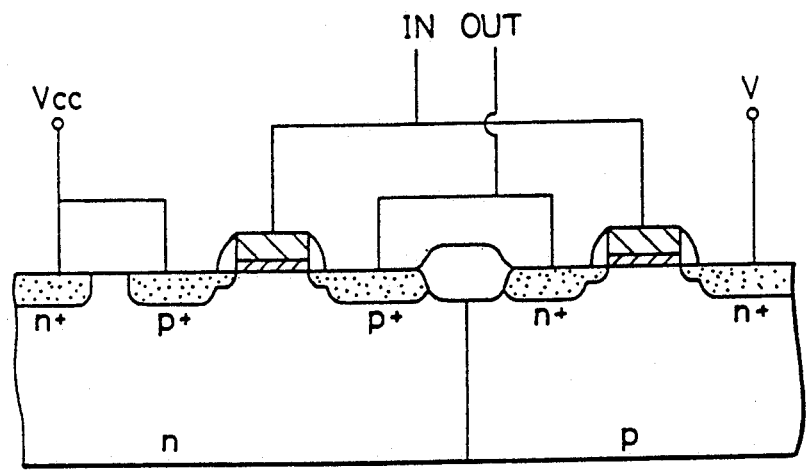
FIG. 9 is a diagram schematically showing a cross-sectional structure of a CMOS inverter to which the present invention is applied and showing connections thereof.

Moreover, the foregoing first through third embodiments are particularly effective for formation of a circuit element of a CMOS structure such as CMOS inverter having the connections shown in FIG. 9.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having first and second field effect transistors, each said transistor including
    a gate electrode formed on said semiconductor substrate with a gate insulating film interposed therebetween;
    a first side wall spacer having a first predetermined thickness formed of one layer of an insulating film on opposite side wall surfaces of said gate electrode; and
    source and drain regions, each comprising laterally arranged high and/or low impurity concentration regions, outwardly formed from portions close to opposite side portions of said gate electrode on said surface of said semiconductor substrate,
    at least said second field effect transistor including a second side wall spacer having a second predetermined thickness greater than said first predetermined thickness formed of another layer of an insulating film formed at least on one side wall surface of said gate electrode,
    the first side wall spacer for said first field effect transistor forming a diffusion mask for implanting said high impurity concentration regions respectively on opposite sides of said gate electrode, and
    the second side wall spacer for said second field effect transistor forming a diffusion mask for implanting said high impurity concentration regions on at least one side of said gate electrode,
    wherein said first field effect transistor is an n-channel type and said second field effect transistor is a p-channel type.

2. The semiconductor device in accordance with claim 1, wherein each said layer of the insulating film is formed at a slightly different depth in said semiconductor substrate.

3. The semiconductor device in accordance with claim 1, wherein said first and second field effect transistors define a complementary MOS field effect transistor.

4. A semiconductor device comprising:
    a complementary MOS field effect circuit including a semiconductor substrate having a first conductivity type region at least in the vicinity of its surface, wherein a p-channel field effect transistor in which said first conductivity type is a p-type, and an n-channel field effect transistor in which said first conductivity type is an n-type, are formed on said semiconductor substrate and isolated from each other by an element insulation region, wherein each said field effect transistor comprises a gate electrode formed on said semiconductor substrate with a gate insulating film interposed therebetween, side wall spacers formed on said walls of said gate electrode, and source/drain regions outwardly formed from portions close to opposite side portions of said gate electrode on said surface of said semiconductor substrate, and further wherein said side wall spacers each are formed by a predetermined number of discrete layers of insulating films and have a composite width selected in correspondence to the side of said gate electrode at which said each side wall spacer resides, a composite side wall spacer width for said p-channel field effect transistor being greater than a composite sidewall spacer width for said N-channel field effect transistor.

5. The semiconductor device in accordance with claim 4, wherein the number of discrete layers for a given side wall spacer is different from the number of layers for other side wall spacers of said circuit.

6. The semiconductor device in accordance with claim 4, wherein thicknesses of discrete layers for a given side wall spacer are different from thicknesses of corresponding layers for other side wall spacers of said circuit.

* * * * *